United States Patent
Matsumoto et al.

(10) Patent No.: US 7,579,870 B2
(45) Date of Patent: Aug. 25, 2009

(54) LEVEL SHIFTER

(75) Inventors: Akinori Matsumoto, Osaka (JP); Shiro Sakiyama, Kyoto (JP); Takashi Morie, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/976,671

(22) Filed: Oct. 26, 2007

(65) Prior Publication Data

US 2008/0191743 A1   Aug. 14, 2008

(30) Foreign Application Priority Data

Feb. 9, 2007   (JP) ............................ 2007-030167

(51) Int. Cl.
*H03K 19/0175* (2006.01)
(52) U.S. Cl. ........................................ 326/80; 327/333
(58) Field of Classification Search .................. 326/68, 326/81–83, 115; 327/333
See application file for complete search history.

(56) References Cited

U.S. PATENT DOCUMENTS

| | | | |
|---|---|---|---|
| 4,703,199 A | 10/1987 | Ely | |
| 5,650,742 A | 7/1997 | Hirano | |
| 6,014,041 A * | 1/2000 | Somasekhar et al. | 326/115 |
| 6,407,579 B1 | 6/2002 | Goswick | |
| 6,532,178 B2 | 3/2003 | Taub | |
| 6,873,186 B2 * | 3/2005 | Gion | 326/68 |
| 6,937,065 B2 | 8/2005 | Aoki | |
| 7,053,658 B1 * | 5/2006 | Blankenship et al. | 326/81 |
| 7,132,856 B2 * | 11/2006 | Hsu et al. | 326/81 |
| 2005/0156631 A1 * | 7/2005 | Huang | 326/81 |
| 2006/0091907 A1 * | 5/2006 | Khan | 326/81 |

FOREIGN PATENT DOCUMENTS

JP    11-308092    11/1999

* cited by examiner

*Primary Examiner*—Rexford N Barnie
*Assistant Examiner*—Crystal L Hammond
(74) *Attorney, Agent, or Firm*—McDermott Will & Emery LLP

(57) ABSTRACT

Input transistors have sources which are connected to a first input reference node and gates to which a pair of input signals are input. Input-side voltage relaxing transistors have sources connected to drains of the pair of input transistors and gates connected to a second input reference node. Output-side voltage relaxing transistors have sources connected to output nodes, gates connected to a first output reference node, and drains connected to drains of the input-side voltage relaxing transistors. First and second inverter circuits are in correspondence with the output nodes, and are connected between second and third output reference nodes. Each of the first and second inverter circuits also supplies a voltage at one of the second and third output reference nodes to its corresponding one of the output nodes, depending on a voltage at its non-corresponding one of the output nodes.

10 Claims, 9 Drawing Sheets

LEVEL SHIFTER

BACKGROUND OF THE INVENTION

1. Field of the Invention

The present invention relates to a level shifter for shifting a level of an input signal.

2. Description of the Related Art

In recent years, a level shifter is used in SRAM or flash EEPROM memories or the like so as to apply a negative voltage to a control gate to drive the memory. Such a level shifter outputs an output signal having a varying level which can take a negative value. Such a level shifter is disclosed in Japanese Unexamined Patent Application Publication No. 11-308092 (Patent Document 1) or the like.

FIG. 8 shows a configuration of the level shifter described in Patent Document 1. The level shifter outputs an output signal LO having a negative level in response to an input signal IN when a negative voltage control signal C is supplied and an output signal LO having the same level as that of the input signal IN when the negative voltage control signal C is not supplied. The level shifter comprises a negative voltage generating circuit 90 which outputs a voltage having a negative level or a ground level as a negative voltage signal VB1 in response to the negative voltage control signal C, a pair of transistors (P91, P92) which receive the input signal IN and its inverted input signal INB, a pair of transistors (N91, N92) which receive the negative voltage signal VB1, and transistors P93, P94, N93 and N94. The transistors P93, P94, N93 and N94 are used to reduce the source-drain voltage of each transistor. When the negative voltage signal VB1 is at the ground level, an inverted control signal CB having the L level is supplied to the transistors N93 and N94. When the negative voltage signal VB1 is at the negative level, an inverted control signal CB having the H level is supplied to the transistors N93 and N94. Voltages VA, VB, VC, VD and VE at nodes in the level shifter vary depending on the input signal IN, as shown in FIG. 9. In FIG. 9, "VTP" indicates a threshold voltage of the transistors P93 and P94, and "VTN" indicates a threshold voltage of the transistors N93 and N94.

However, in the conventional level shifter, for example, when the current driving ability of the transistor N93 is small, a rise time Tc of the source voltage VC is longer than a rise time Te of the drain voltage VE in the transistor N93, so that the source-drain voltage is likely to increase. For example, if the source voltage VC has not reached "–VTN" when the drain voltage VE reaches "Vdd", the maximum value of the source-drain voltage of the transistor N93 exceeds "Vdd+VTN".

Thus, the breakdown voltage of a transistor needs to be strictly limited (e.g., the maximum value of the source-drain voltage of the transistor needs to be estimated to be large). As a result, the transistor is caused to have a high breakdown voltage. Therefore, an additional process for increasing the breakdown voltage may disadvantageously lead to an increase in cost or an increase in circuit area.

SUMMARY OF THE INVENTION

An object of the present invention is to reduce the source-drain voltage of a transistor and thereby relax the breakdown voltage limit of the transistor.

According to the present invention, a level shifter is provided for receiving a pair of input signals varying with complementary levels and shifting the levels of the pair of input signals, comprising a pair of input transistors having a pair of sources connected in common to a first input reference node and a pair of gates to which the pair of input signals are input, a pair of input-side voltage relaxing transistors having a pair of sources connected to a pair of drains of the pair of input transistors and a pair of gates connected in common to a second input reference node, and for limiting voltages at the pair of drains of the pair of input transistors, a pair of output nodes, a pair of output-side voltage relaxing transistors having a pair of sources connected to the pair of output nodes, a pair of gates connected in common to a first output reference node, and a pair of drains connected to the pair drains of the pair of input-side voltage relaxing transistors, and for limiting voltages at the pair of output nodes, and a first inverter circuit and a second inverter circuit in one-to-one correspondence with the pair of output nodes and each connected between a second output reference node and a third output reference node. Each of the first and second inverter circuits supplies a voltage at one of the second and third output reference nodes to its corresponding one of the output nodes, depending on a voltage at its non-corresponding one of the output nodes.

In the level shifter, when a voltage is supplied from the output-side voltage relaxing transistor to an output node, a voltage from a corresponding inverter circuit is also supplied to the output node, so that the rate of variation of a voltage at the output node is increased. Thus, the source-drain voltage can be reduced due to the increased voltage variation rate at the output node.

DETAILED DESCRIPTION OF THE PREFERRED EMBODIMENTS

Figure 1:
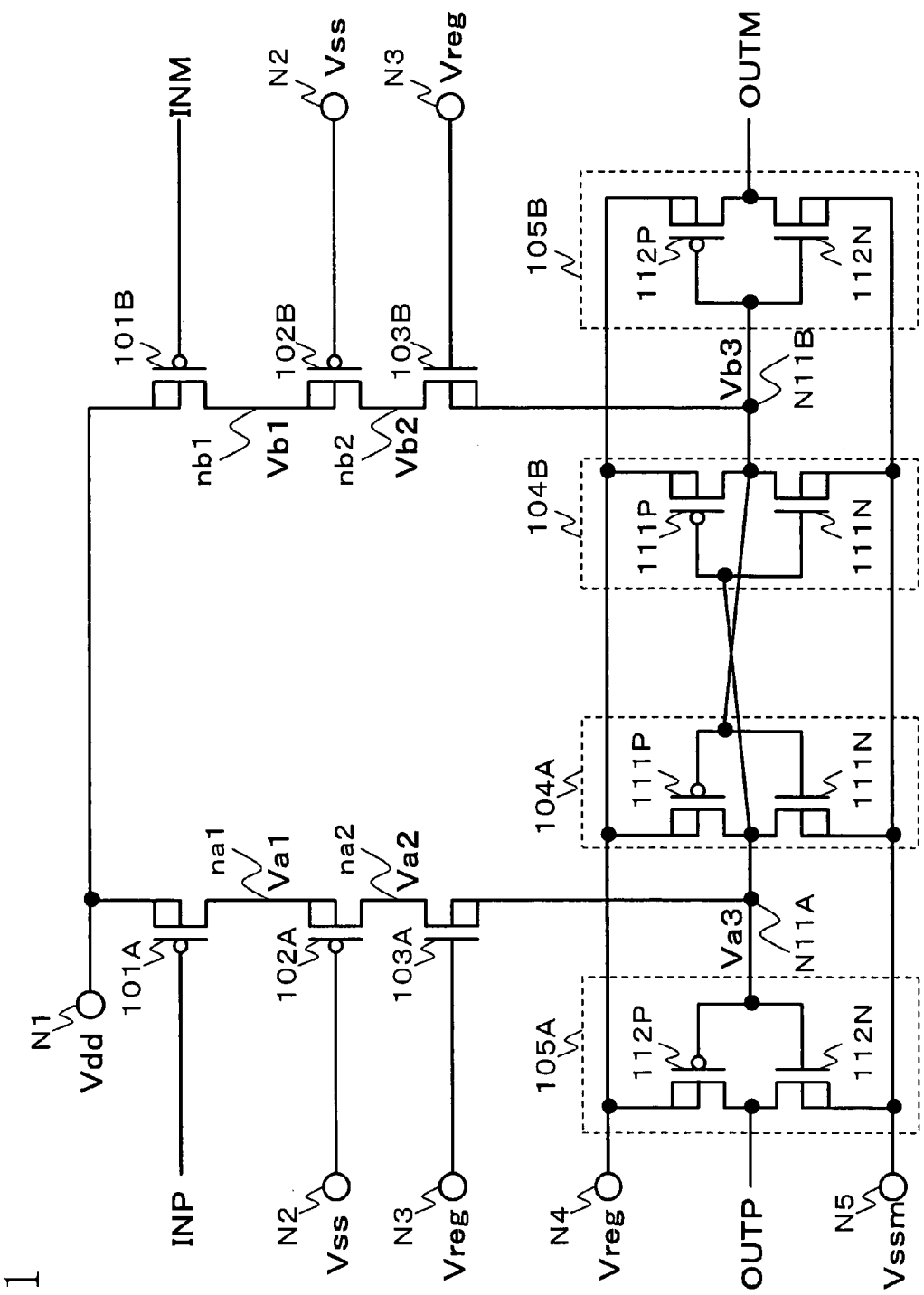
FIG. 1 is a circuit diagram showing a configuration of a level shifter according to a first embodiment of the present invention.

Hereinafter, embodiments of the present invention will be described with reference to the accompanying drawings. The same or like parts are indicated by the same reference numerals and will not be repeatedly described.

First Embodiment

FIG. 1 shows a configuration of a level shifter according to a first embodiment of the present invention. The level shifter shifts the levels of a pair of input signals (INP, INM) and outputs the results as a pair of output signals (OUTP, OUTM). The level shifter comprises a pair of input transistors (101A, 101B), a pair of voltage relaxing transistors (102A, 102B), a pair of voltage relaxing transistors (103A, 103B), inverter circuits 104A and 104B, and output circuits 105A and 105B.

The input signals INP and INM are signals which have complementary levels varying between a positive level (Vdd) and a ground level (Vss). A reference node N1 (first input reference node) receives a voltage (Vdd) corresponding to the H level of an input signal. A reference node N2 (second input reference node) receives a voltage (Vss) corresponding to the L level of an input signal.

A reference node N3 (first output reference node) and a reference node N4 (second output reference node) receive a voltage (Vreg) corresponding to the H level of an output signal. A reference node N5 (third output reference node) receives a voltage (Vssm) corresponding to the L level of an output signal. Here, the voltage Vssm is a negative voltage. The reference node N4 and the reference node N3 may be a common node. Note that the voltages applied to the reference nodes N3 and N4 may not be the same.

The input transistor pair (101A, 101B) supplies a voltage at the reference node N1 to one of a pair of drains (nodes na1, nb1), depending on the voltage levels of the input signal pair (INP, INM).

The voltage relaxing transistor pair (102A, 102B) limits voltages (Va1, Vb1) at the nodes na1 and nb1 so that the voltages of the drain pair (nodes na1, nb1) of the input transistor pair (101A, 101B) do not become lower than "Vss".

The voltage relaxing transistor pair (103A, 103B) limits voltages (Va3, Vb3) at output nodes N11A and N11B not to exceed "Vreg".

The inverter circuit 104A corresponds to the output node N11A, and the inverter circuit 104B corresponds to the output node N11B. The inverter circuit 104A supplies one of the output voltages Vreg and Vssm to the output node N11A, depending on the voltage at the output node N11B. The inverter circuit 104A includes select transistors 111P and 111N connected in series between the reference nodes N4 and N5. The inverter circuit 104B has a similar configuration.

The output circuits 105A and 105B are auxiliary buffer circuits, have a configuration similar to that of the inverter circuits 104A and 104B, and include output transistors 112P and 112N connected in series between the reference nodes N4 and N5. The output circuit 105A outputs one of the output voltages Vreg and Vssm as the output signal OUTP, depending on the voltage at the output node N11A.

Figure 2:
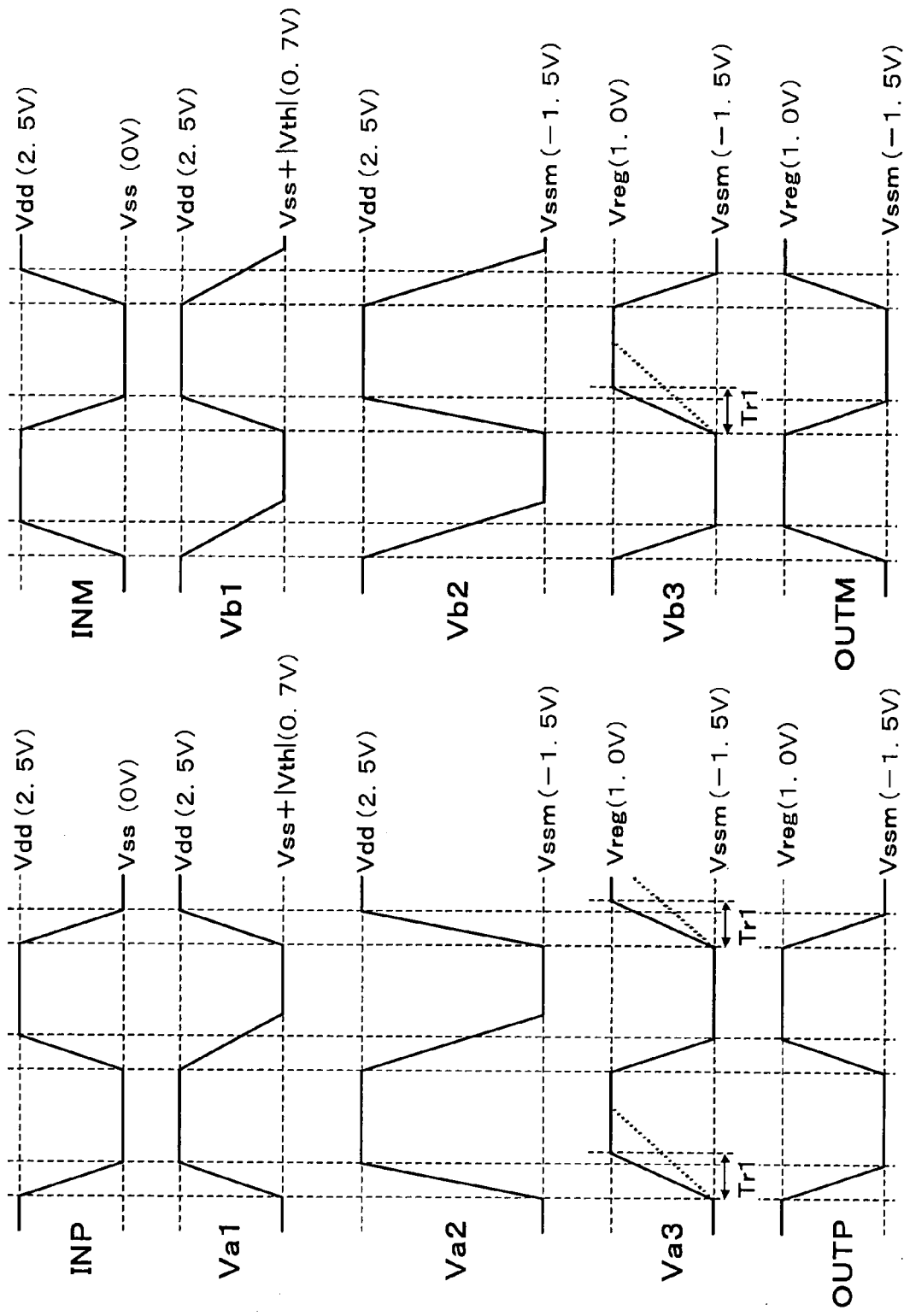
FIG. 2 is a waveform diagram for describing an operation of the level shifter of FIG. 1.

Next, an operation of the level shifter of FIG. 1 will be described with reference to FIG. 2. Note that the threshold voltage of the voltage relaxing transistors 102A and 102B is assumed to be "Vth". Also, it is assumed that Vdd=2.5 [V], Vs=0 [V], Vreg=1.0 [V], Vssm=−1.5 [V], and Vth=0.7 [V]. Specifically, this is an example in which the level shifter is comprised of 2.5-V transistors, and the input signals INP and INM having a level varying between "2.5 V" and "0 V" are shifted to the output signals OUTP and OUTM having a level varying between "1.0 V" and "−1.5 V".

Initially, when the input signal INP goes from the "H level (Vdd)" to the "L level (Vss)", a current flows through the input transistor 101A, so that the voltage (Va1) at the node na1 starts rising. Since the voltage relaxing transistor 102A is in the ON state, a current flows through the voltage relaxing transistor 102A, so that a voltage (Va2) at a node na2 starts rising. Since the voltage relaxing transistor 103A is in the ON state, a current flows through the voltage relaxing transistor 103A, so that the voltage (Va3) at the output node N11A starts rising.

On the other hand, the input signal INM goes from the "L level (Vss)" to the "H level (Vdd)", so that a current of the input transistor 101B is interrupted, and the voltage (Vb1) at the node nb1 starts dropping. Also, a voltage (Vb2) at a node nb2 starts dropping.

When the voltage (Va3) at the output node N11A starts rising, a current starts flowing through the select transistor 111N in the inverter circuit 104B, so that the voltage (Vb3) at the output node N11B starts dropping. Thereby, a current starts flowing through the select transistor 111P in the inverter circuit 104A, so that the rising rate of the voltage (Va3) at the output node N11A increases. When the voltage (Va3) at the output node N11A reaches the gate voltage (Vreg) of the voltage relaxing transistor 103A, the current of the voltage relaxing transistor 103A is interrupted.

When the voltage (Vb3) at the output node N11B becomes lower than the gate voltage (Vreg) of the voltage relaxing transistor 103B, a current flows through the voltage relaxing transistor 103B, so that the voltage (Vb2) at the node nb2 drops.

Thus, not only a positive-level voltage is supplied from the voltage relaxing transistor 103A, but also a voltage (positive-level voltage) is supplied from the inverter circuit 104A to the output node N11A, so that the voltage at the output node N11A increases at a rate higher than in the conventional art (i.e., a rise time Tr1 of the voltage Va3 is reduced).

On the other hand, when the input signal INP goes from the "L level (Vss)" to the "H level (Vdd)", the inverter circuit 104B assists in the rising of the voltage at the output node N11B.

As described above, the rate of the variation of a voltage at an output node can be increased, so that the variation of the drain voltage of a voltage relaxing transistor (output side) can be allowed to follow the variation of the source voltage thereof. Thereby, the source-drain voltage can be reduced, thereby making it possible to relax the breakdown voltage limit of the voltage relaxing transistor (output side). Also, the levels of the output signal pair can be quickly transitioned in response to the transition of the levels of the input signal pair, thereby making it possible to improve the response of an output signal to an input signal.

Also, a relationship in the magnitude of the current driving ability between each transistor is preferably the following. Note that the relationship in the magnitude of the current driving ability can be set as a ratio (W/L) of a gate width to a gate length.

Input transistor 101A (101B)>Select transistor 111N

Voltage relaxing transistor 102A (102B)>Input transistor 101A (101B)

Voltage relaxing transistor 103A (103B)>Select transistor 111N

By setting the current driving ability of each transistor in this manner, it is possible to certainly achieve voltage rise/voltage drop at each node.

Note that the output circuits 105A and 105B may be each connected between the reference node N3 and the reference node N5 instead of between the reference node N4 and the reference node N5. With such an arrangement, it is also possible to output an output signal having a level varying between the positive level "Vreg" and the negative level "Vssm".

Also, voltages applied to the reference nodes N1, N2, N3, N4 and N5 are not limited to Vdd, Vss, Vreg, Vreg and Vssm, and may be set to any voltages which satisfy the breakdown voltage limit of each transistor. For example, in FIG. 1, if a voltage applied to the reference nodes N3 and N4 is changed from the output voltage Vreg to the ground voltage Vss, it is possible to output a pair of output signals (OUTP, OUTM) having a level varying between the ground level "Vss" and the negative level "Vssm".

Variation of First Embodiment

Figure 3:
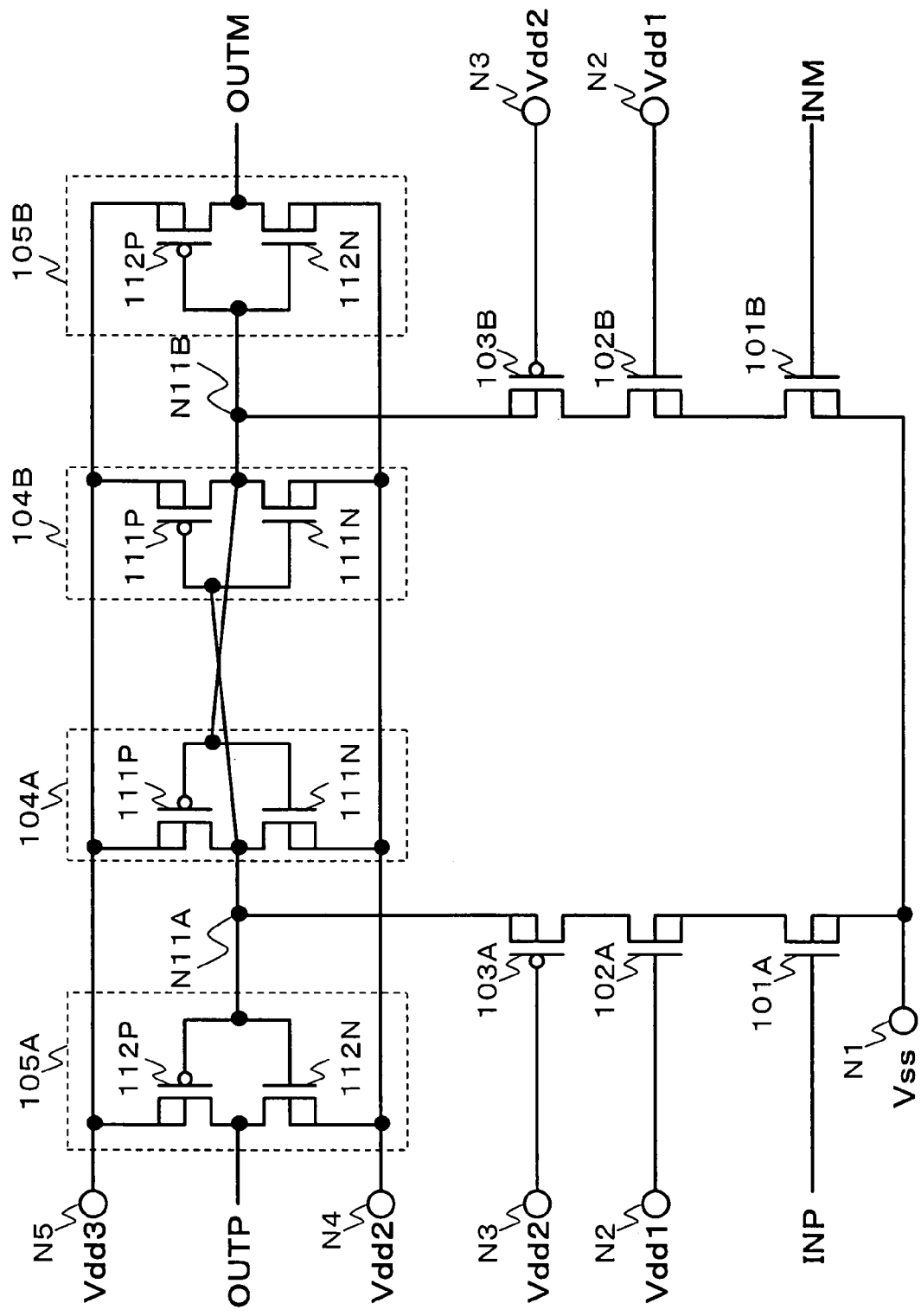
FIG. 3 is a circuit diagram showing a variation of the level shifter of FIG. 1.

As shown in FIG. 3, if the transistors of FIG. 1 are arranged so that the polarities thereof are inverted and voltages Vss (0 [V]), Vdd1 (1 [V]), Vdd2 (2 [V]), Vdd2 (2 [V]) and Vdd3 (3 [V]) are applied to the reference nodes N1 to N5, it is possible to shift the input signals INP and INM having a level varying between the positive level "Vdd1" and the ground level "Vss" to a pair of output signals (OUTP, OUTM) having a level varying between the positive level "Vdd3" and the positive level "Vdd2". Thus, it is possible to output a pair of output signals having a level varying between a positive level and a positive level.

Second Embodiment

Figure 4:
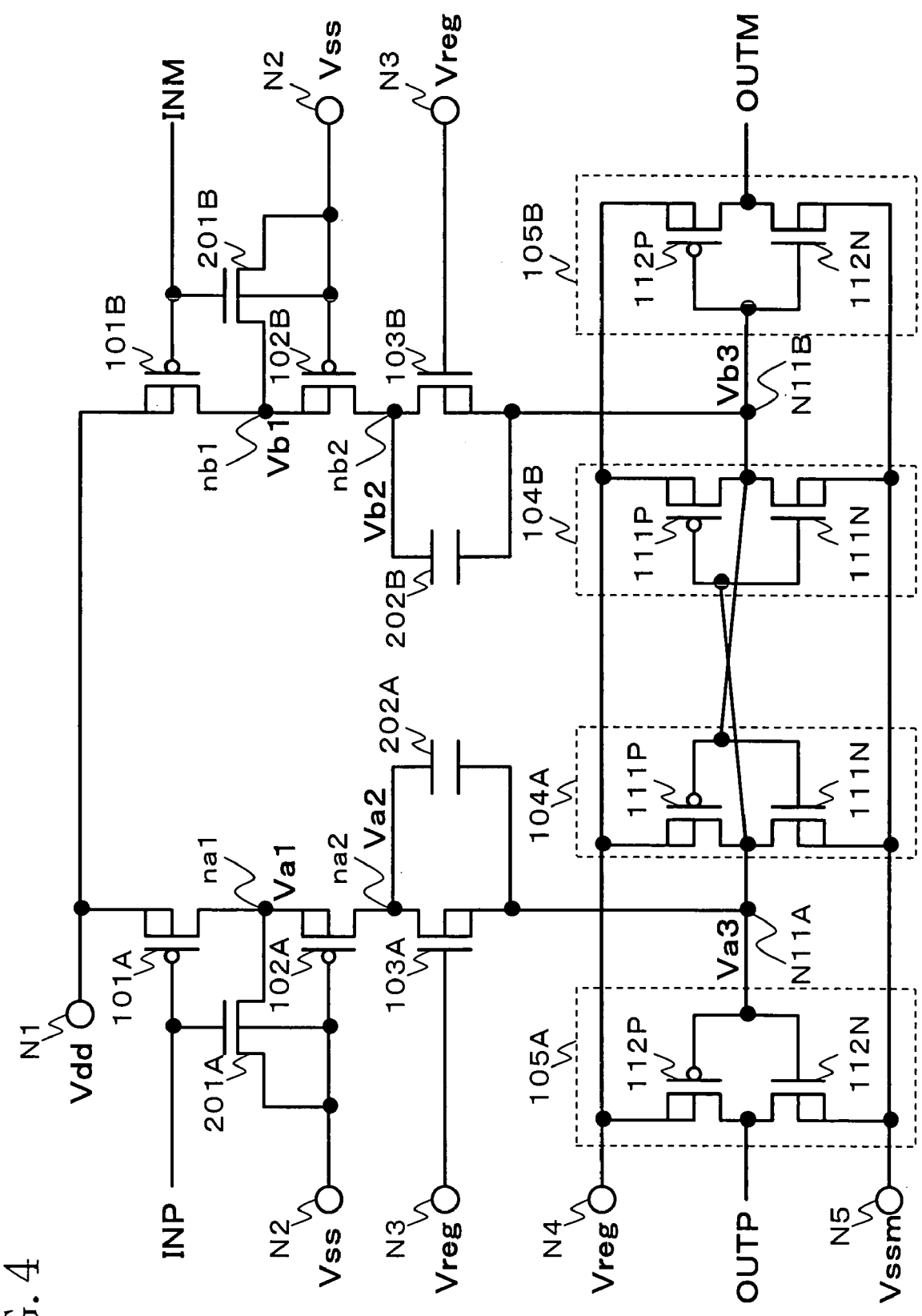
FIG. 4 is a circuit diagram showing a configuration of a level shifter according to a second embodiment of the present invention.

FIG. 4 shows a configuration of a level shifter according to a second embodiment of the present invention. This level shifter comprises, in addition to the parts of FIG. 1, auxiliary transistors 201A and 201B and capacitance elements (capacitance sections) 202A and 202B. The gate of the auxiliary transistor 201A is connected to the gate of the input transistor 101A (the input signal INP is input thereto), the source thereof is connected to the reference node N2, and the drain thereof is connected to the source of the voltage relaxing transistor 102A. The auxiliary transistor 201B has a similar configuration. The capacitance element 202A is connected between the source and drain of the voltage relaxing transistor 103A. The capacitance element 202B has a similar configuration.

Figure 5:
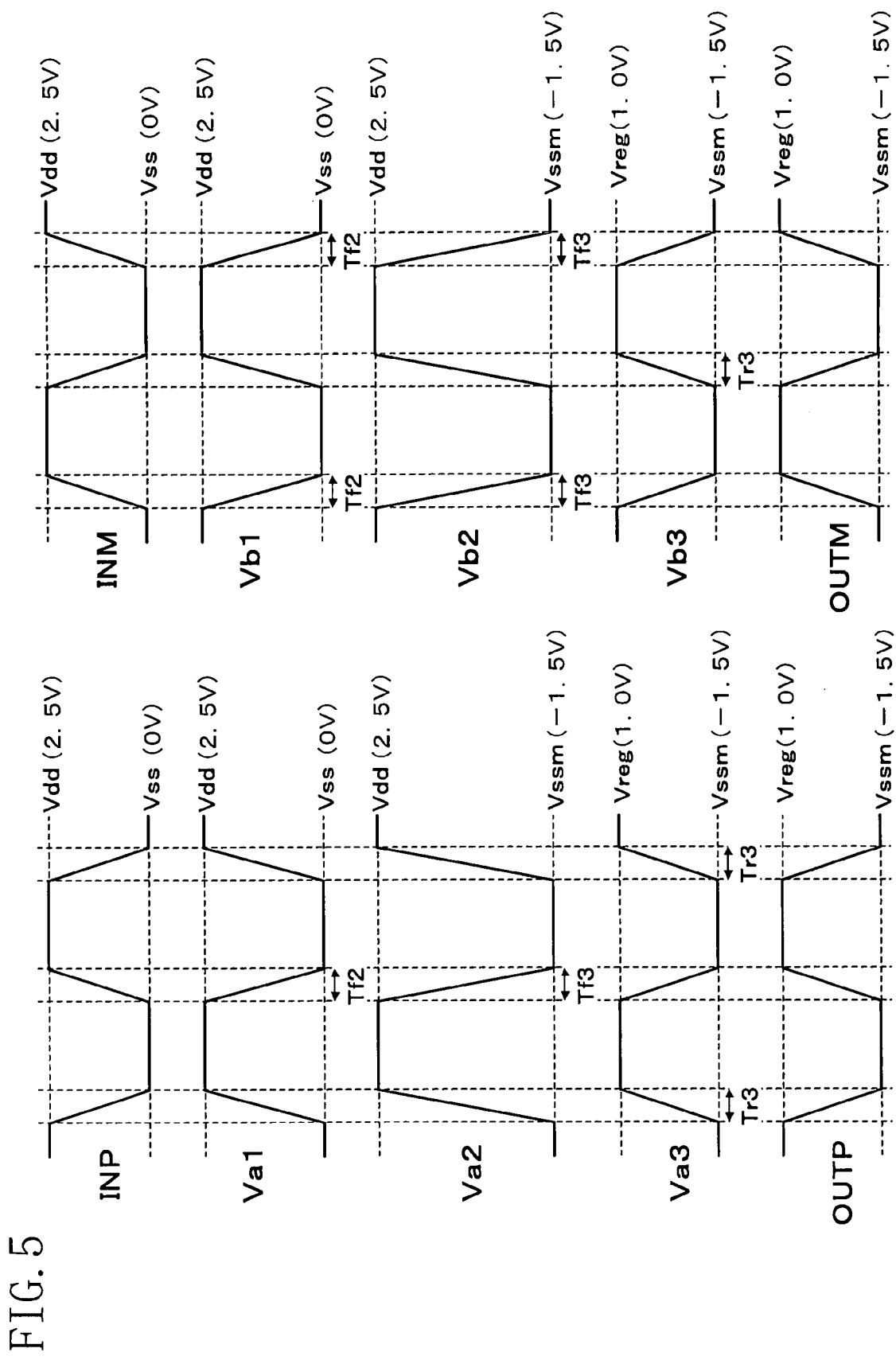
FIG. 5 is a waveform diagram for describing an operation of the level shifter of FIG. 4.

Next, an operation by the auxiliary transistors 201A and 201B of FIG. 4 and an operation by the capacitance elements 202A and 202B of FIG. 4 will be described with reference to FIG. 5.

[Auxiliary Transistors]

When the input signal INP goes from the "L level (Vss)" to the "H level (Vdd)", the auxiliary transistor 201A goes to the ON state, so that the source and gate of the voltage relaxing transistor 102A are short-circuited. Thereby, the voltage (Va1) at the node na1 drops to "Vss" at a rate higher than in FIG. 1 (i.e., a fall time Tf2 of the voltage Va1 is reduced).

Also, since the voltage (Va1) at the node na1 goes to the gate voltage "Vss" of the voltage relaxing transistor 102A, the maximum value of the source-drain voltage of the voltage relaxing transistor 102A goes to "Vss-Vssm", which is smaller than in FIG. 1.

On the other hand, when the input signal INP goes from the "H level (Vdd)" to the "L level (Vss)", the auxiliary transistor 201A goes to the OFF state, which is an operation similar to that of FIG. 1.

Also, the auxiliary transistor 201B performs a similar operation.

[Capacitance Elements]

When the input signal INP goes from the "H level (Vdd)" to the "L level (Vss)", the voltage (Va2) at the node na2 starts rising. Variation of the voltage at the node na2 is transferred via the capacitance element 202A to the source (output node N11A) of the voltage relaxing transistor 103A, so that the voltage (Va3) at the output node N11A starts rising, following the voltage Va2. As a result, the voltage at the output node N11A rises at a rate higher than in FIG. 1 (i.e., a rise time Tr3 of the voltage Va3 is reduced).

On the other hand, when the input signal INP goes from the "L level (Vss)" to the "H level (Vdd)", the voltage (Va3) at the output node N11A starts dropping. Variation of the voltage at the output node N11A is transferred via the capacitance element 202A to the drain (node na2) of the voltage relaxing transistor 103A, so that the voltage (Va2) at the node na2 starts dropping, following the voltage Va3. As a result, the voltage at the node na2 drops at a rate higher than in FIG. 1 (i.e., a fall time Tf3 of the voltage Va2 is reduced).

Also, the capacitance element 202B performs a similar operation.

As described above, by providing auxiliary transistors, the source voltage of a voltage relaxing transistor (input side) can be fixed to "Vss" when an input transistor is not driven, so that the breakdown voltage limit of the voltage relaxing transistor (input side).

Also, by providing capacitance elements, voltage variations at the opposite ends of a voltage relaxing transistor (output side) can be caused to follow each other, thereby making it possible to further reduce the source-drain voltage of the voltage relaxing transistor (output side).

Figure 6:
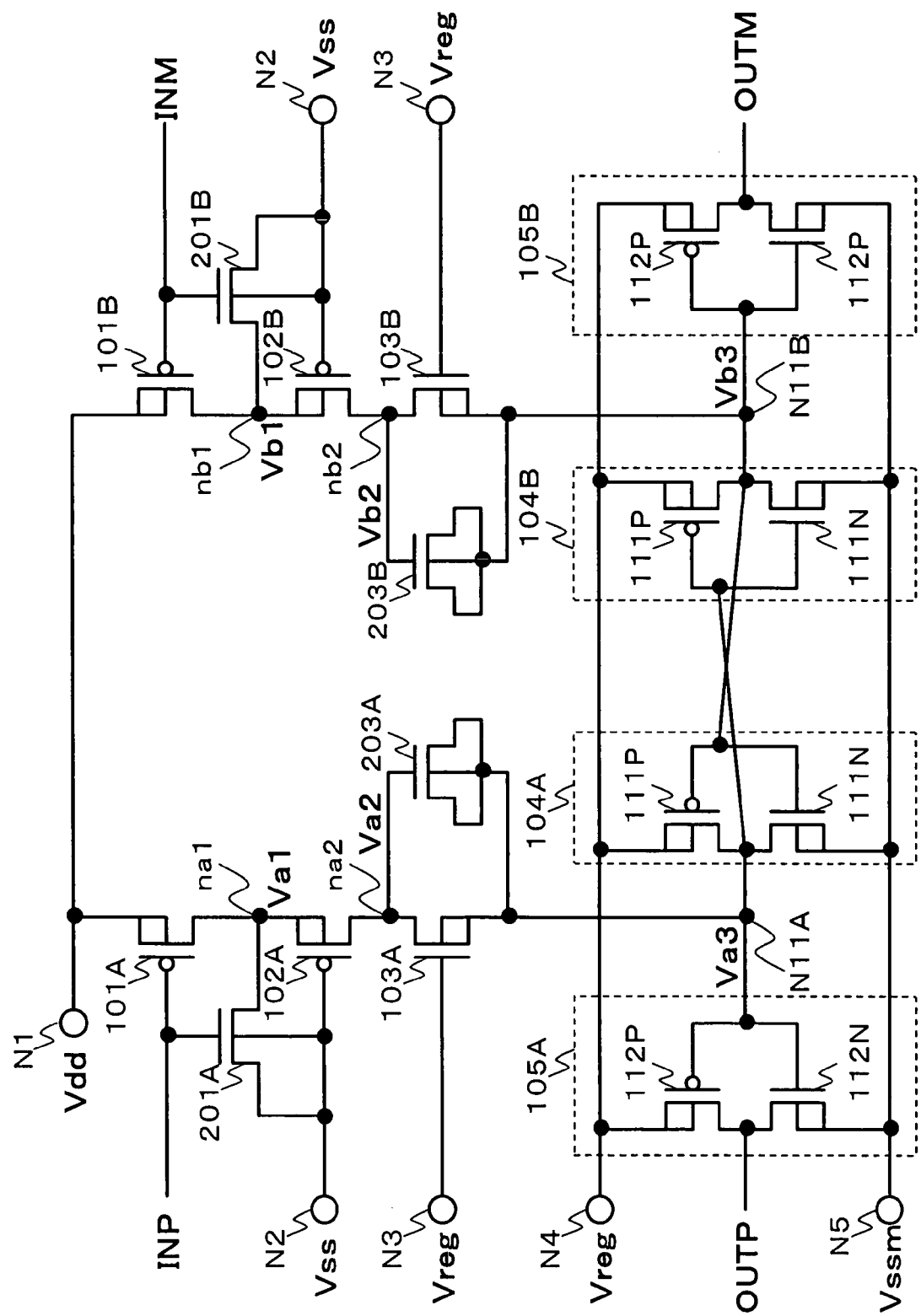
FIG. 6 is a circuit diagram showing a variation of the level shifter of FIG. 4.

Note that, as shown in FIG. 6, when MOS transistors 203A and 203B are provided instead of the capacitance elements 202A and 202B, a similar effect can be obtained. The gate of the MOS transistor 203A is connected to the drain of the voltage relaxing transistor 103A, and the source, drain and substrate of the MOS transistor 203A are connected to the source of the voltage relaxing transistor 103A.

Third Embodiment

Figure 7:
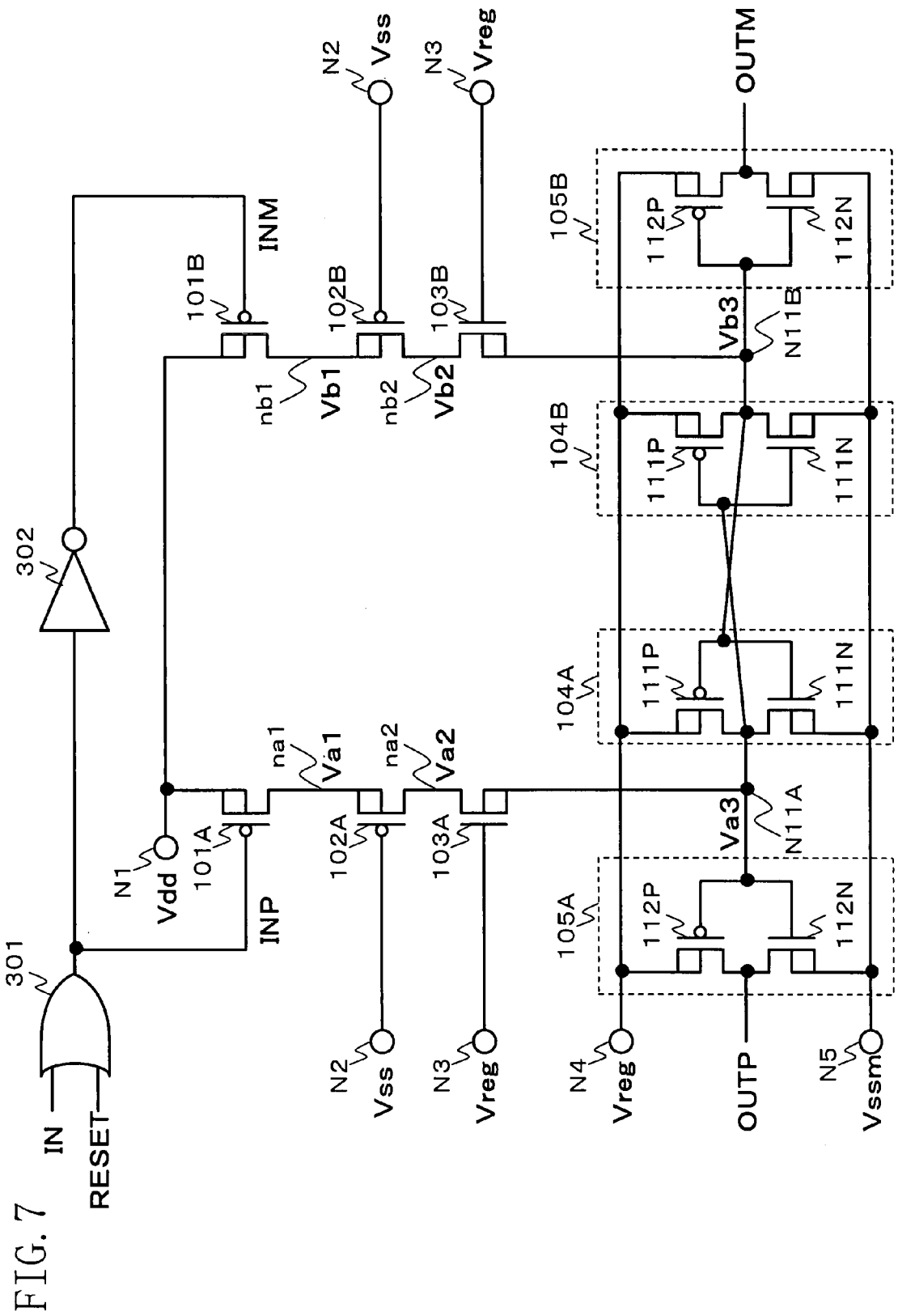
FIG. 7 is a circuit diagram showing a configuration of a level shifter according to a third embodiment of the present invention.
Figure 8:
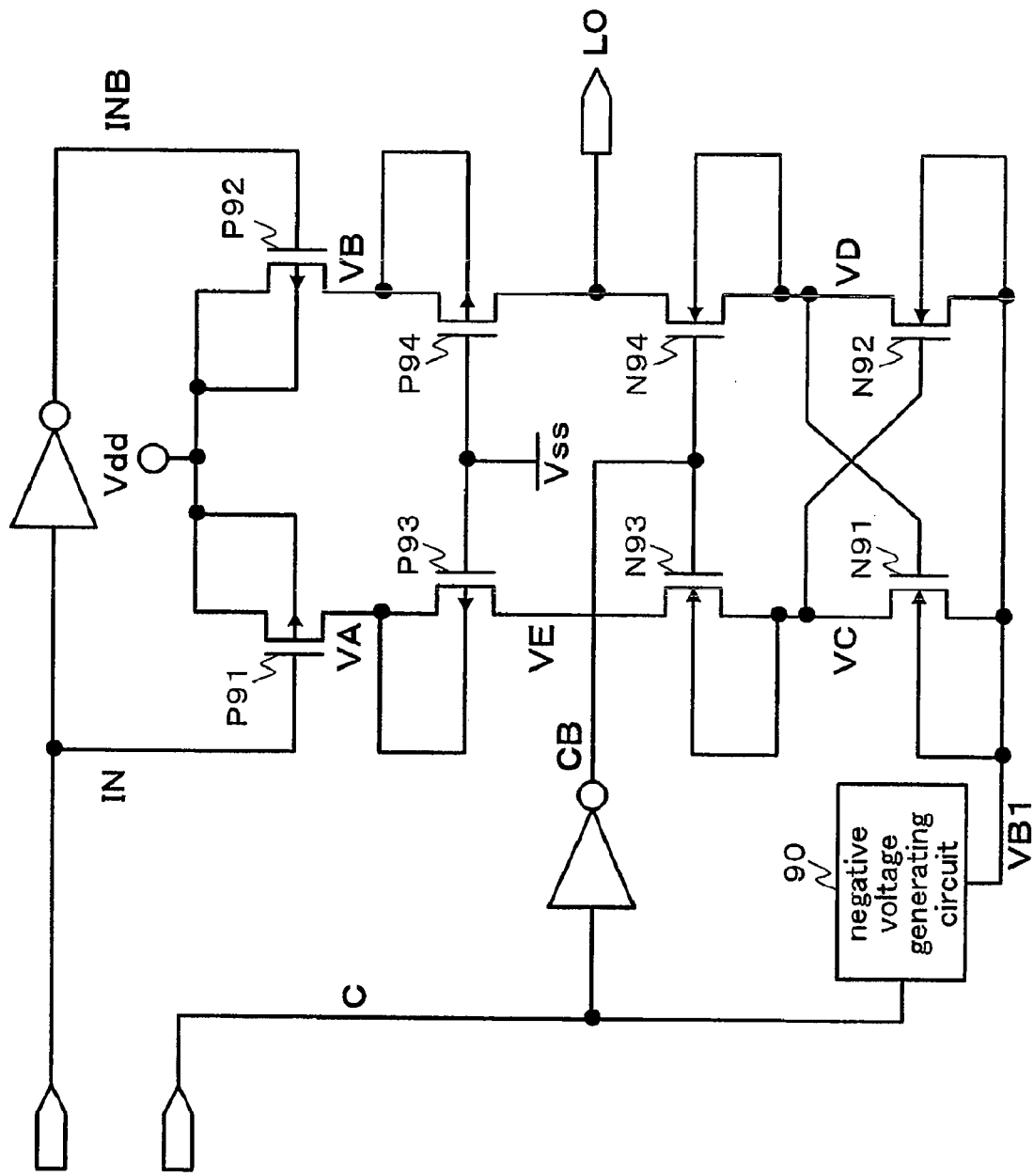
FIG. 8 is a diagram showing a configuration of a conventional level shifter.
Figure 9:
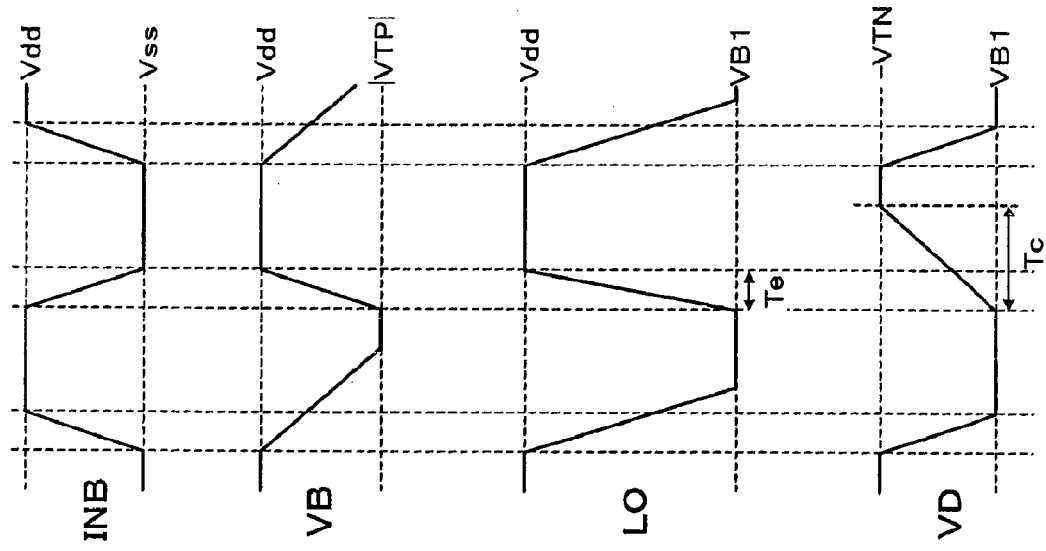
FIG. 9 is a waveform diagram for describing an operation of the level shifter of FIG. 8.
Figure 9:
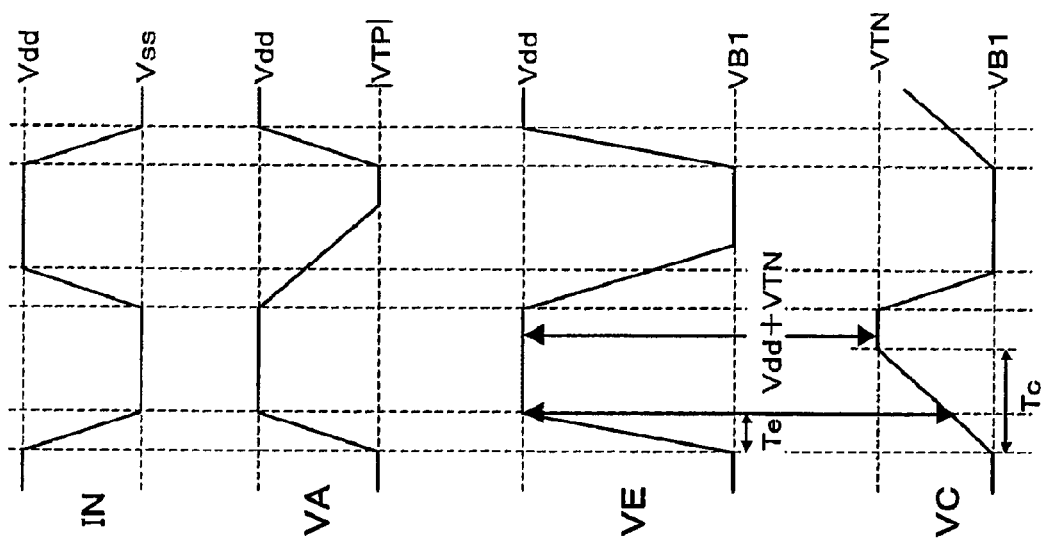

FIG. 7 shows a configuration of a level shifter according to a third embodiment according to the present invention. This level shifter comprises, in addition to the parts of FIG. 1, a reset circuit 301 and an inverter circuit 302.

The reset circuit (signal supplying section) 301 receives a reference signal IN and a reset signal RESET, and when the reset signal RESET is at the "L level", supplies the reference signal IN as the input signal INP to the gate of the input transistor 101A. The reference signal IN and the reset signal RESET are each, for example, a signal having a level varying between a positive level (Vdd) and a ground level (Vss). On the other hand, when the reset signal RESET is at the "H level", the reset circuit 301 supplies the "H level" input signal INP to the input transistor 101A without depending on the logic level of the reference signal IN (i.e., the voltage level of the reference signal IN is forcedly fixed to the "H level").

The inverter circuit (signal inverting section) 302 inverts a signal from the reset circuit 301, and supplies the result as the input signal INM to the gate of the input transistor 101B.

Next, a reset operation of the level shifter by the reset circuit 301 and the inverter circuit 302 will be described. When the reset signal RESET supplied from the reset circuit 301 goes to the "H level", a signal (the input signal INP) from the reset circuit 301 goes to the "H level" and a signal (the input signal INM) from the inverter circuit 302 goes to the "L level". Thereby, the voltages (Va3, Vb3) at the output nodes N11A and N11B can be fixed to the L level (Vssm) and the H level (Vreg), respectively, thereby making it possible to settle the logics of the inverter circuits 104A and 104B.

As described above, the level shifter can be forcedly reset, thereby making it possible to settle the internal states of the inverters 104A and 104B. Thereby, for example, it is possible to avoid a situation in which the output nodes N11A and N11B become stable at an intermediate potential, so that a through current continues to flow from the reference node N4 to the reference node N5.

Note that the reset circuit 301 and the inverter circuit 302 are also applicable to the level shifters of FIGS. 3, 4 and 6.

What is claimed is:

1. A level shifter for receiving a pair of input signals varying with complementary levels and shifting the levels of the pair of input signals, comprising:

a pair of input transistors having a pair of sources connected in common to a first input reference node and a pair of gates to which the pair of input signals are input;

a pair of input-side voltage relaxing transistors having a pair of sources connected to a pair of drains of the pair of input transistors and a pair of gates connected in common to a second input reference node, and for limiting voltages at the pair of drains of the pair of input transistors;

a pair of output nodes;

a pair of output-side voltage relaxing transistors having a pair of sources connected to the pair of output nodes, a pair of gates connected in common to a first output reference node, and a pair of drains connected to the pair drains of the pair of input-side voltage relaxing transistors, and for limiting voltages at the pair of output nodes; and a first inverter circuit and a second inverter circuit in one-to-one correspondence with the pair of output nodes and each connected between a second output reference node and a third output reference node, wherein each of the first and second inverter circuits supplies a voltage at one of the second and third output reference nodes to one corresponding to said inverter circuit of the output nodes, depending on a voltage at one not corresponding to said inverter circuit of the output nodes.

2. The level shifter of claim 1, wherein each of the first and second inverter circuits includes:

a first select transistor having a source connected to the second output reference node, a drain connected to the output node corresponding to said inverter circuit, and a gate connected to the output node not corresponding to said inverter circuit; and a second select transistor having a source connected to the third output reference node, a drain connected to the output node corresponding to said inverter circuit, and a gate connected to the output node not corresponding to said inverter circuit.

3. The level shifter of claim 2, wherein the current driving ability of the pair of input transistors is greater than the current driving ability of the second select transistor, the current driving ability of the pair of input-side voltage relaxing transistors is greater than the current driving ability of the pair of input transistors, and the current driving ability of the pair of output-side voltage relaxing transistors is greater than the current driving ability of the second select transistor.

4. The level shifter of claim 1, wherein a voltage supplied to the second output reference node is equal to a voltage supplied to the first output reference node.

5. The level shifter of claim 1, further comprising:

a first auxiliary transistor having a gate to which one of the pair of input signals is input, a source connected to the second input reference node, and a drain connected to the source of one of the pair of input-side voltage relaxing transistors; and a second auxiliary transistor having a gate to which the other of the pair of input signals is input, a source connected to the second input reference node, and a drain connected to the source of the other of the pair of input-side voltage relaxing transistors.

6. The level shifter of claim 1, further comprising:

a first capacitance section connected between the source and drain of one of the pair of output-side voltage relaxing transistors; and a second capacitance section connected between the source and drain of the other of the pair of output-side voltage relaxing transistors.

7. The level shifter of claim 6, wherein each of the first and second capacitance sections is a capacitance element.

8. The level shifter of claim 6, wherein each of the first and second capacitance sections is a MOS transistor.

9. The level shifter of claim 1, further comprising:

a signal supplying section for receiving a reference signal and supplying the reference signal as one of the pair of input signals to the gate of one of the pair of input transistors; and a signal inverting section for inverting the reference signal from the signal supplying section and supplying the inverted reference signal as the other of the pair of input signals to the gate of the other of the pair of input transistors.

10. The level shifter of claim 9, wherein the signal supplying section further receives a control signal, and fixes a voltage level of the reference signal, depending on the control signal.

* * * * *